(12) United States Patent
Bradley et al.

(10) Patent No.: US 7,019,965 B2
(45) Date of Patent: Mar. 28, 2006

(54) EJECTOR MECHANISM AND A CARRIER INCLUDING SAME

(75) Inventors: David M. Bradley, Sacramento, CA (US); William L. Grouell, San Ramon, CA (US); Glenn Charest, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 628 days.

(21) Appl. No.: 10/261,853

(22) Filed: Sep. 30, 2002

(65) Prior Publication Data

US 2005/0111178 A1    May 26, 2005

(51) Int. Cl.
*G06F 1/16* (2006.01)
(52) U.S. Cl. .................. 361/685; 361/683; 361/686
(58) Field of Classification Search ............... 361/679, 361/683, 685, 686
See application file for complete search history.

(56) References Cited

U.S. PATENT DOCUMENTS

| | | | |
|---|---|---|---|
| 4,586,097 A | 4/1986 | Koike et al. | |
| 5,319,519 A * | 6/1994 | Sheppard et al. | 361/685 |
| 5,602,717 A | 2/1997 | Leshem et al. | |
| 5,757,583 A | 5/1998 | Ogawa et al. | |
| 5,790,497 A * | 8/1998 | Hayashi | 720/602 |
| 5,912,799 A | 6/1999 | Grouell et al. | |
| 6,070,251 A | 5/2000 | Chong, Jr. | |
| 6,089,889 A * | 7/2000 | Chiou et al. | 439/159 |
| 6,089,890 A * | 7/2000 | Oguchi et al. | 439/159 |
| 6,195,225 B1 | 2/2001 | Komatsu et al. | |
| 6,247,944 B1 | 6/2001 | Bolognia et al. | |
| 6,271,984 B1 | 8/2001 | Ogawa et al. | |
| 6,302,714 B1 | 10/2001 | Bolognia et al. | |
| 6,349,357 B1 | 2/2002 | Chong, Jr. | |
| 6,370,605 B1 | 4/2002 | Chong, Jr. | |
| 6,397,267 B1 | 5/2002 | Chong, Jr. | |
| 6,430,147 B1 | 8/2002 | Goto et al. | |

* cited by examiner

*Primary Examiner*—Yean-Hsi Chang
(74) *Attorney, Agent, or Firm*—Blakely, Sokoloff, Taylor & Zafman LLP

(57) ABSTRACT

An ejector mechanism. The ejector mechanism includes an ejector pair, pivotally mounted on a surface of the carrier. Each ejector of the ejector pair comprises an ejector slot that is engageable with an ejector pin that is located on a chassis, which accommodates the carrier. A plurality of gear teeth are configured into each ejector wherein the gear teeth on one ejector engage or disengage with the gear teeth on another ejector as the ejector pair pivotally rotates about a point on the carrier. A handle is affixed to one ejector to facilitate the moving of the ejector pair.

36 Claims, 10 Drawing Sheets

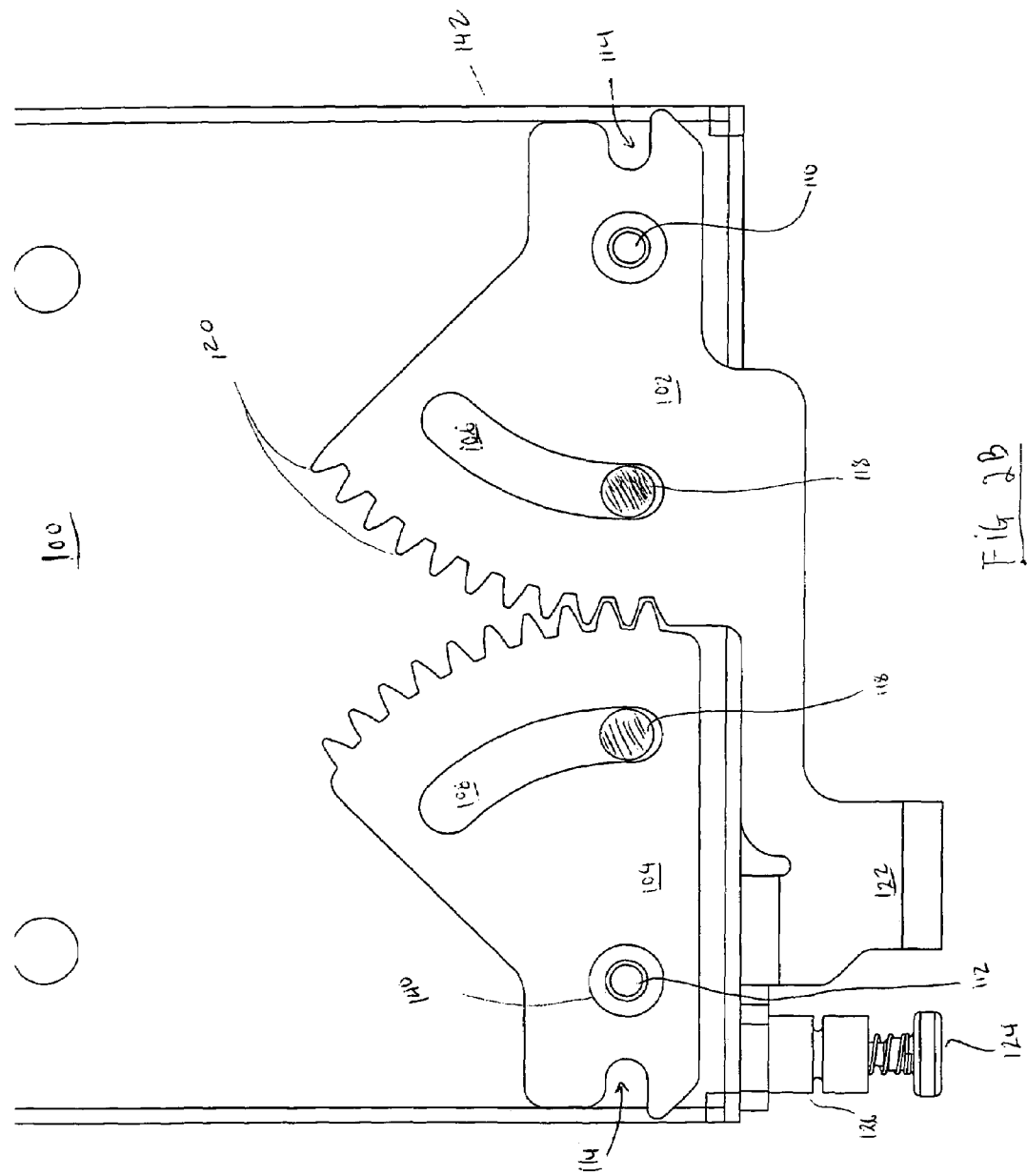

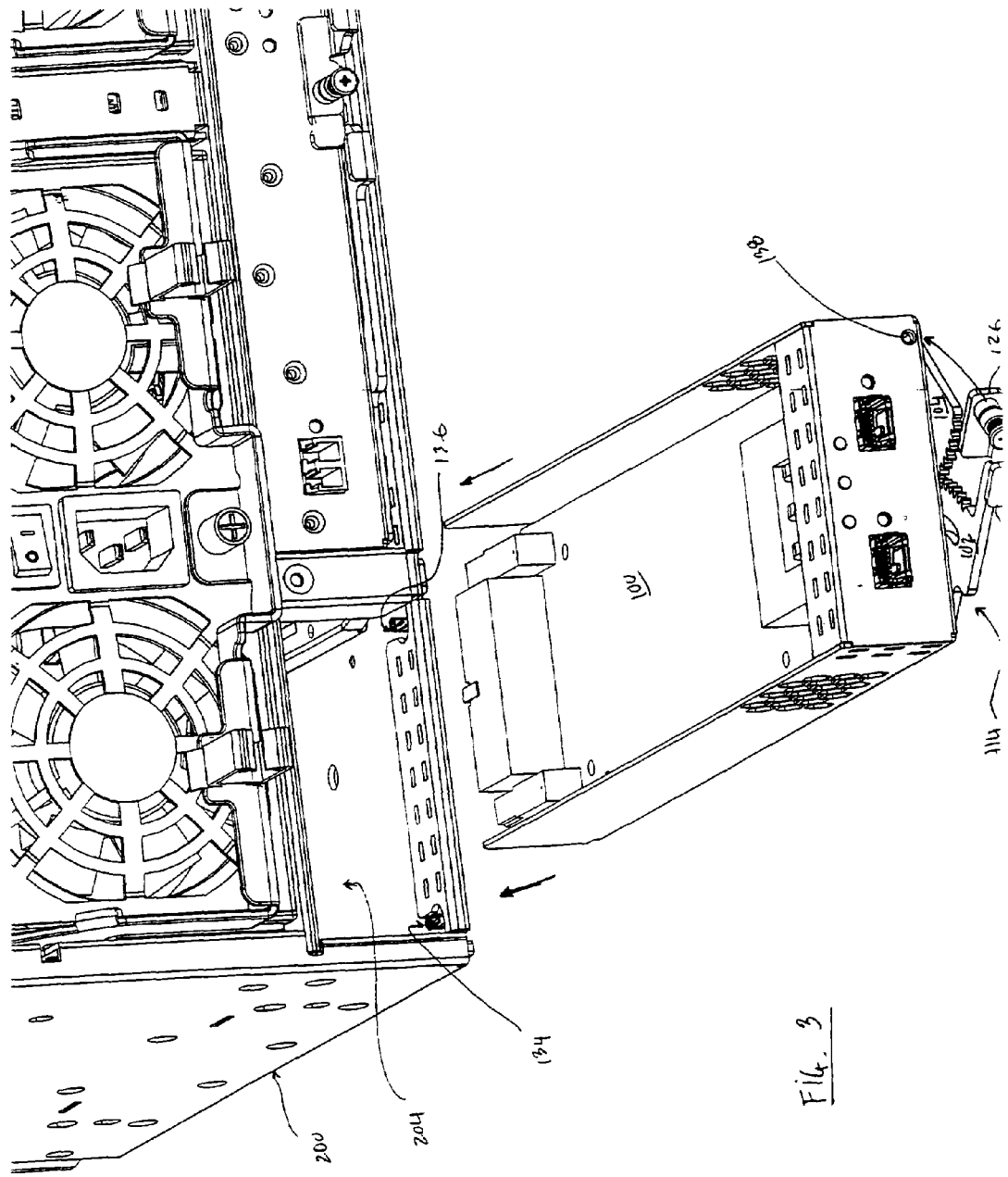

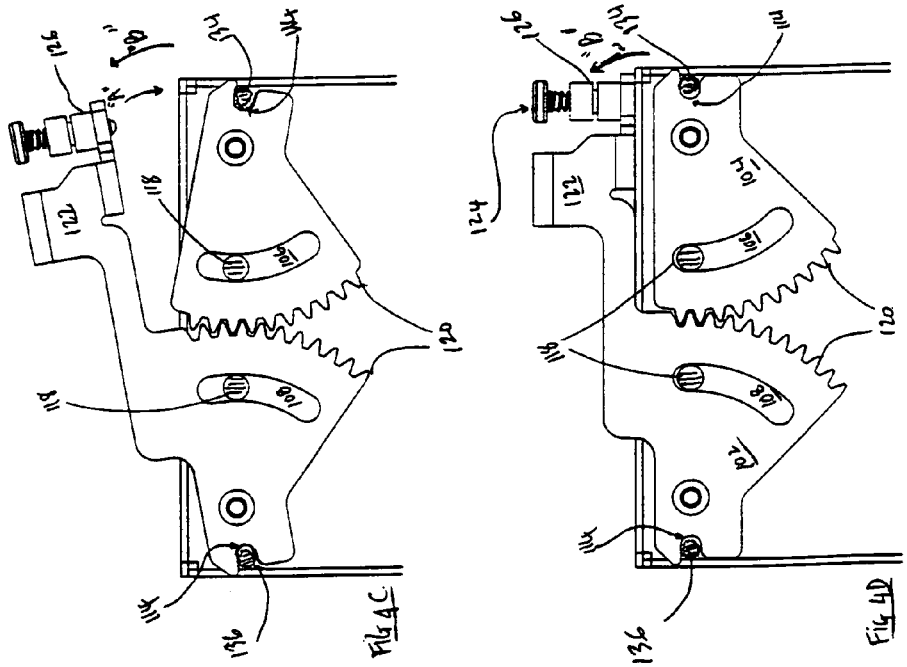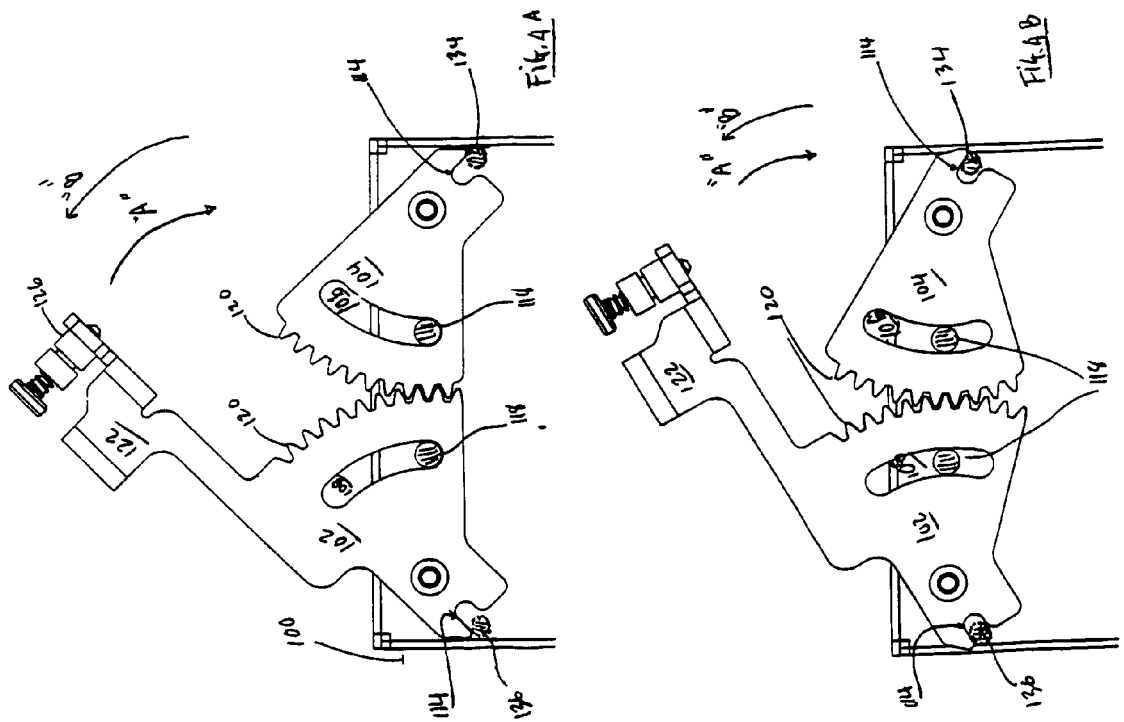

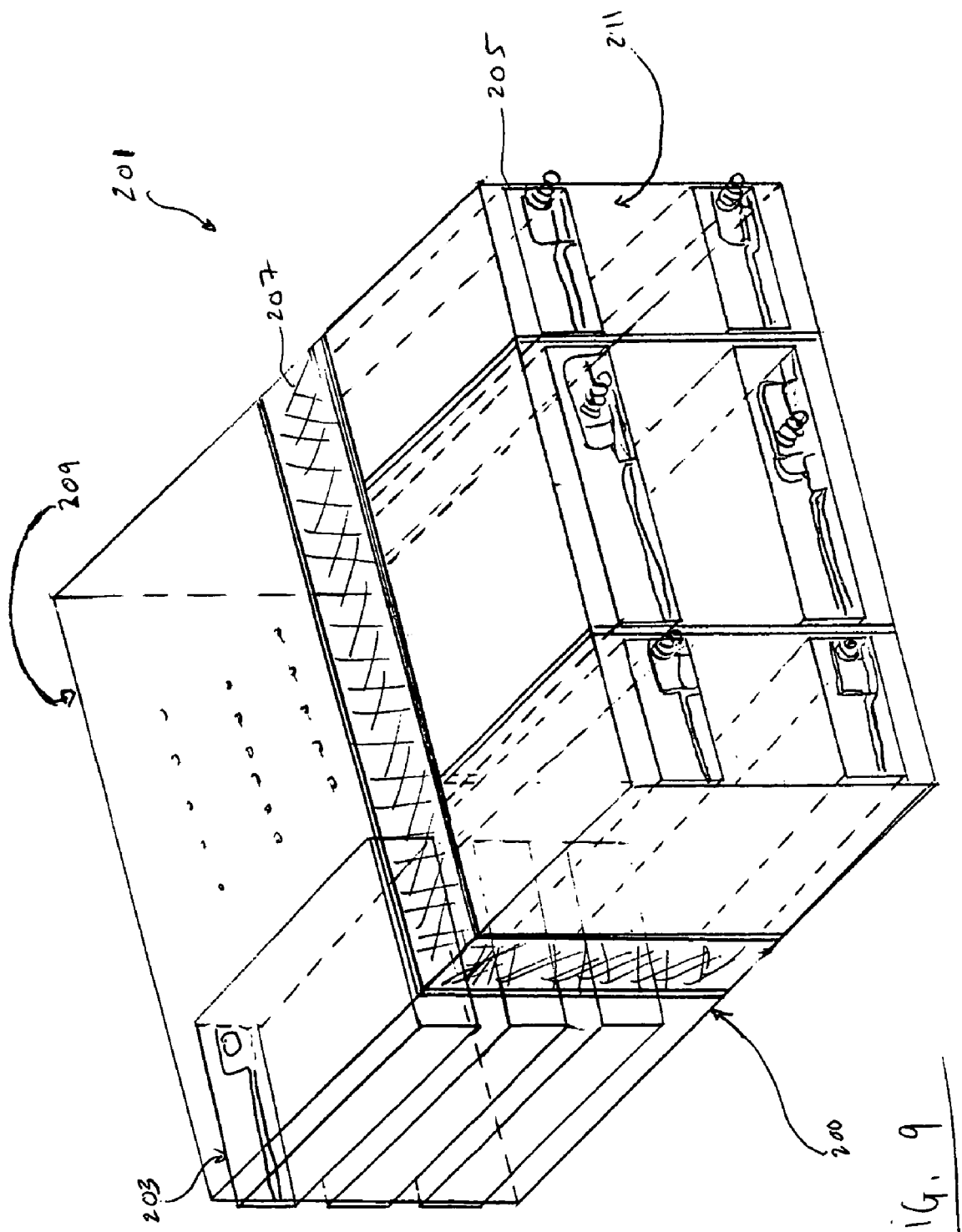

EJECTOR MECHANISM AND A CARRIER INCLUDING SAME

FIELD

The present inventions relates to mounting and supporting carriers that support electronic devices, such as data storage devices and circuit boards, that are pluggable into computer systems and more particularly relates to apparatuses that facilitate insertions of the carriers into the computer system and ejections of the carriers from the computer system.

BACKGROUND

Electronic devices in a computer system take many different forms. They may be circuit boards or data storages such as hard disk drives, CD-ROM drives, DVD-ROM drives, and removable hard drives.

The electronic devices mentioned are often mounted in a housing structure that couples to a computer system. Often, they are mounted vertically or horizontally in a stacked manner. (See FIG. 1). In many computer systems, such as file servers, a carrier is typically used to support each of the particular electronic device that is inserted into the computer systems. For ease of transport and sharing of the electronic device from systems to system, the carrier is slidably insertable into and removable from the housing structure that couples to the computer system. A computer system may include circuit boards supported by carriers, several disk drives also supported by similar carriers, and a common interconnection board. In one embodiment, the computer system is a file server such as those described in U.S. Pat. No. 5,912,799 and U.S. Pat. No. 6,247,944. In the file server, the carrier permits the insertion of at least one disk drive and at least one circuit board into the computer system's chassis.

Each of the carriers that support the disk drive or the circuit board is equipped with an ejector mechanism. The ejector mechanism facilitates the removal and insertion of the carrier from a housing structure. Typically, the ejector mechanism interacts with the housing structure to facilitate such removal and insertion of the carrier into the housing structure. Conventional ejector mechanisms are complicated for they require many complex parts working in conjunction to remove the carrier. See for example, U.S. Pat. Nos. 5,790,497, 5,757,583, 5,319,519, and 6,247,944. Additionally, the conventional ejector mechanisms are bulky, cumbersome, and often, require a lot of force to eject or remove the carrier from the housing structure. Most disadvantagely, the conventional ejector mechanisms tend to create wobblings of the carrier, as the carrier is being inserted or ejected from the housing structure. Wobblings of the carrier causes damages to connector pins in the data storage device, the circuit board, and the common interconnection board.

SUMMARY

As apparent from the discussion above, it is therefore useful to provide a data storage device and a circuit board which can be inserted and removed with the power "on", and whose carrier will allow the electrical connectors to always be aligned and whose components as well as pins and connectors are preserved against damage caused by misalignment and unwanted power.

The exemplary embodiments of the present invention relates to an ejector mechanism for a carrier, which is adaptable to carry or support an electronic device therein. The ejector mechanism includes an ejector pair, pivotally mounted on a surface of the carrier. Each ejector of the ejector pair comprises an ejector slot that is engageable with an ejector pin that is located on a chassis, which accommodates the carrier. The ejector slot engages with the ejector pin to lock the carrier into the chassis and the ejector slot disengages with the ejector pin to release the carrier from the chassis. A plurality of gear teeth are configured into each ejector wherein the gear teeth on one ejector engage or disengage with the gear teeth on another ejector as the ejector pair pivotally rotates (moves) about a point on the carrier to release the carrier from the chassis or to lock the carrier into the chassis. A handle is affixed to one ejector to facilitate the moving of the ejector pair. The handle is used to pivotally rotate (move) this ejector causing the gear teeth to engage or disengage the gear teeth on the other ejector and as the gear teeth form the ejector pair engage or disengage, the ejectors are pivotally rotated (moved) simultaneously.

BRIEF DESCRIPTION OF THE DRAWINGS

The invention is further described by way of examples with reference to the accompanying drawings, wherein:

FIG. 2B illustrates an exemplary carrier with an ejector mechanism;

FIG. 3 illustrates an exemplary carrier with an ejector mechanism being inserted into a chassis of a computer system;

FIGS. 4A–4D illustrate an exemplary ejector mechanism with ejector slots engaging or disengaging ejector pins;

FIG. 9 illustrates an exemplary computer system that supports a plurality of data storage devices and circuit boards.

DETAILED DESCRIPTION

The present invention includes a novel carrier with an ejector mechanism that allow an electronic device (e.g., a data storage device and a circuit board) supported by the carrier to be inserted and removed from a housing structure (e.g., a chassis) of a computer system. The carrier, in one embodiment, allows the device's electrical connectors to always be aligned and protects the device's components as well as pins and connectors against the damage caused by misalignment and unwanted power. In the following description, for purposes of explanation, numerous specific details are set forth in order to provide a thorough understanding of the present invention. It will be evident, however, to one skilled in the art that the present invention may be practiced without these specific details. In other instances, specific apparatus structures and methods have not been described so as not to obscure the present invention. The following description and drawings are illustrative of the invention and are not to be construed as limiting the invention.

Figure 1A:
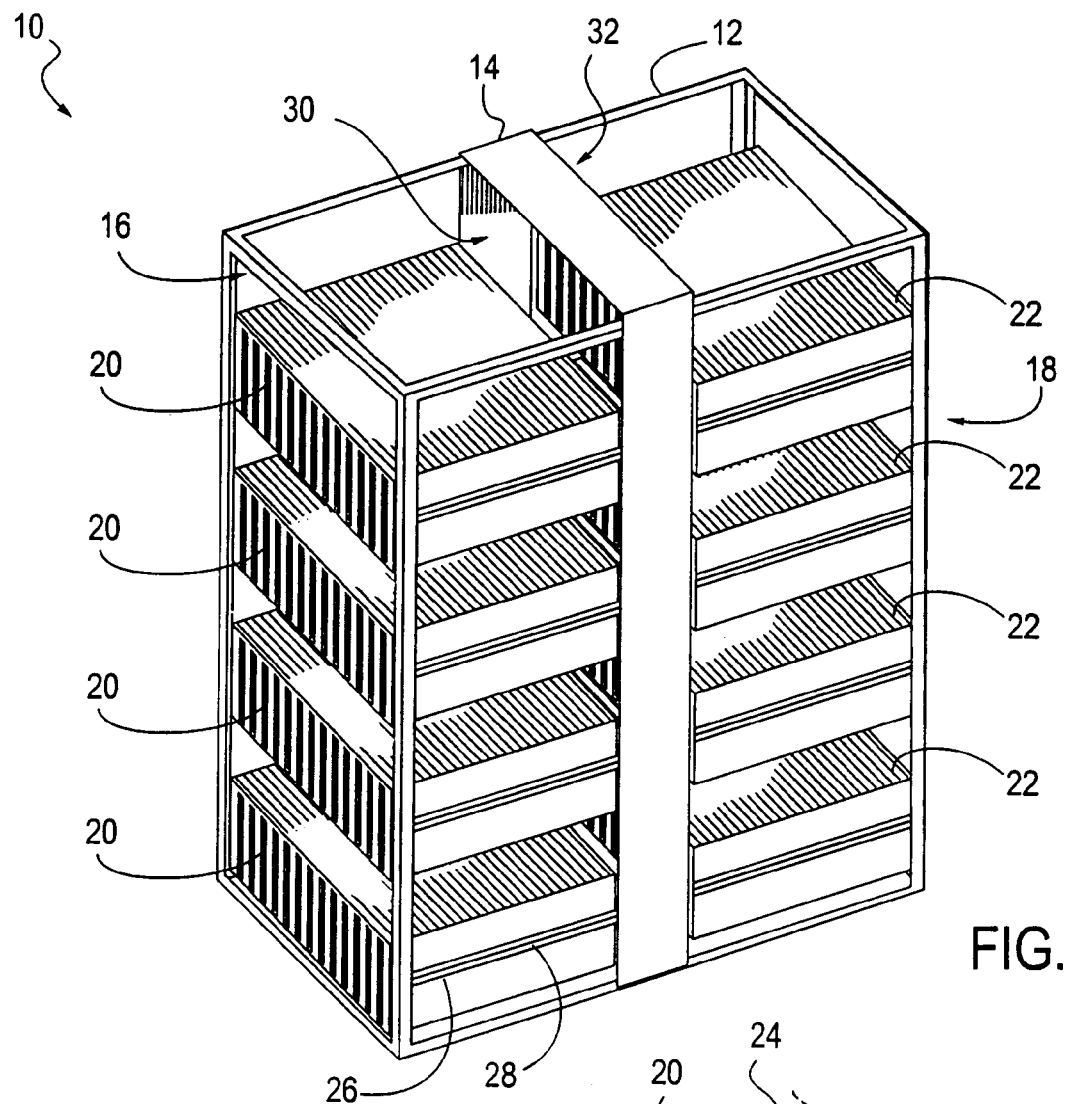
FIG. 1A illustrates an exemplary computer system with carriers that support electronic devices.

FIG. 1A illustrates an exemplary computer system that will benefit from the exemplary embodiments of the present invention.

FIG. 1A illustrates an exemplary file server. The file server 10 includes a cage 12 having a midplane 14, an open front side 16, and an open back side 18. The midplane 14 of the file server 10 includes a common interconnection board to which data storage devices such as disk drives 20 and circuit boards 22 are connected or plugged to. In one embodiment, the circuit boards are inserted into the open back side 18 and the disk drives 20 are inserted into the open front side 16. Inside the cage 12, the disk drives 20 are plugged into one side of the common interconnection board and the circuit boards 22 are plugged into the other side of the common interconnection board. The common interconnection board has electrical connections that can couple to the corresponding electrical connections on the disk drives and the circuit boards. The common interconnection board may also include all of the necessary external connections for the operation of the file server 10.

Figure 1B:
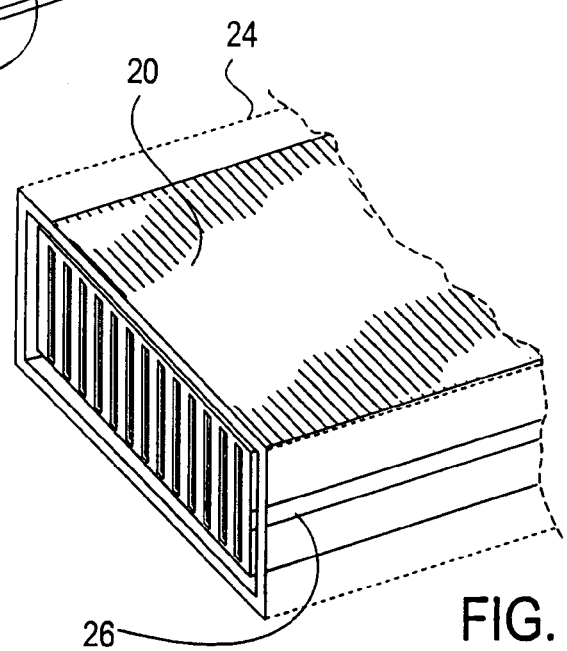
FIG. 1B illustrates an exemplary carrier.

As illustrated in FIG. 1B, an elongated carrier 24 is used to enclose each disk drive, which is fastened to the carrier 24. A carrier similar to the carrier 24 is also used to enclose each of the circuit boards 22 which is fastened to the carrier. An electrical connector (not shown) is typically mounted at one end of the carrier and is electrically interconnected to the disk drive 22 or the circuit board. On side 30 of the midplane 14, the common interconnection board has spaced-apart electrical connectors (not shown), one for each of the connectors of the disk drives 20. On side 32 of the midplane 14, the common interconnection board also has spaced-apart electrical connectors (not shown), one for each of the connectors of the circuit boards 22. Typically, the carrier 24 for the disk drive 20 or the circuit board 22 includes a handle (not shown) coupled to one end of the carrier that is opposite the end that has the electrical connectors. Additionally, each of the carriers 24 also includes a guide rail 26 which is complimentary to another guide rail 28 provided on the cage 12 to guide the insertion or removal of the carrier 24 into the cage 12. To insert the disk drive 20 or the circuit board 22, the carrier 24 is inserted into an appropriate slot within the cage 12 that supports the carrier 24. Once properly inserted, the electrical connectors on the disk drive 20 or the circuit board 22 are plugged into the corresponding electrical connectors provided thereon on the common interconnection board. To remove the disk drive 20 or the circuit board 22 from the cage 12 the handle is used to help pull the carrier 24 out of the slot. The electrical connectors are then unplugged from the common interconnection board.

It is common that these electronic devices are hot-pluggable electronic devices. A hot-pluggable electronic device is an electronic device that has electric connections that permit it to be removed and re-installed within a housing structure that support such electronic device without disturbing the operation of other electronic devices that may be present and receiving and using power (and hence operational) in this housing structure. Hot-pluggable data storage devices or circuit boards are hot-pluggable electronic devices that can be easily transferred and swapped without the need to power down a computer system that supports them. Slidably inserting the storage device and the circuit board gives rise to various lateral forces that act to misalign the mating connectors on each of the data storage device, the circuit board and the interconnection board. Such misalignment potentially damages the connectors or pins on the data storage device, the circuit board, and the interconnection board. Additionally, partial or complete system component failure to the data storage device, the circuit board and/or the interconnection board may occur especially when these electronic devices are hot plugged. For example, electrical connectors and pins on the data storage device may make contact with unintended pins or connectors in the interconnection board or the electronic connectors on the circuit board may contact with unintended connectors in the interconnection board. In both cases, the connectors will cause unintended connection and may ruin the devices. An ejector mechanism of the present invention solves the problems mentioned above. As discussed above, the computer system 10 can be a file server. Alternatively, the computer system 10 can be a network server or a multiple disk drive storage system well known in the art. As will be apparent, the exemplary carriers of the present invention can be incorporated into these systems to facilitate the transport (e.g., insertion and removal) of the electronic devices that are mounted within the carriers.

Figure 2A:
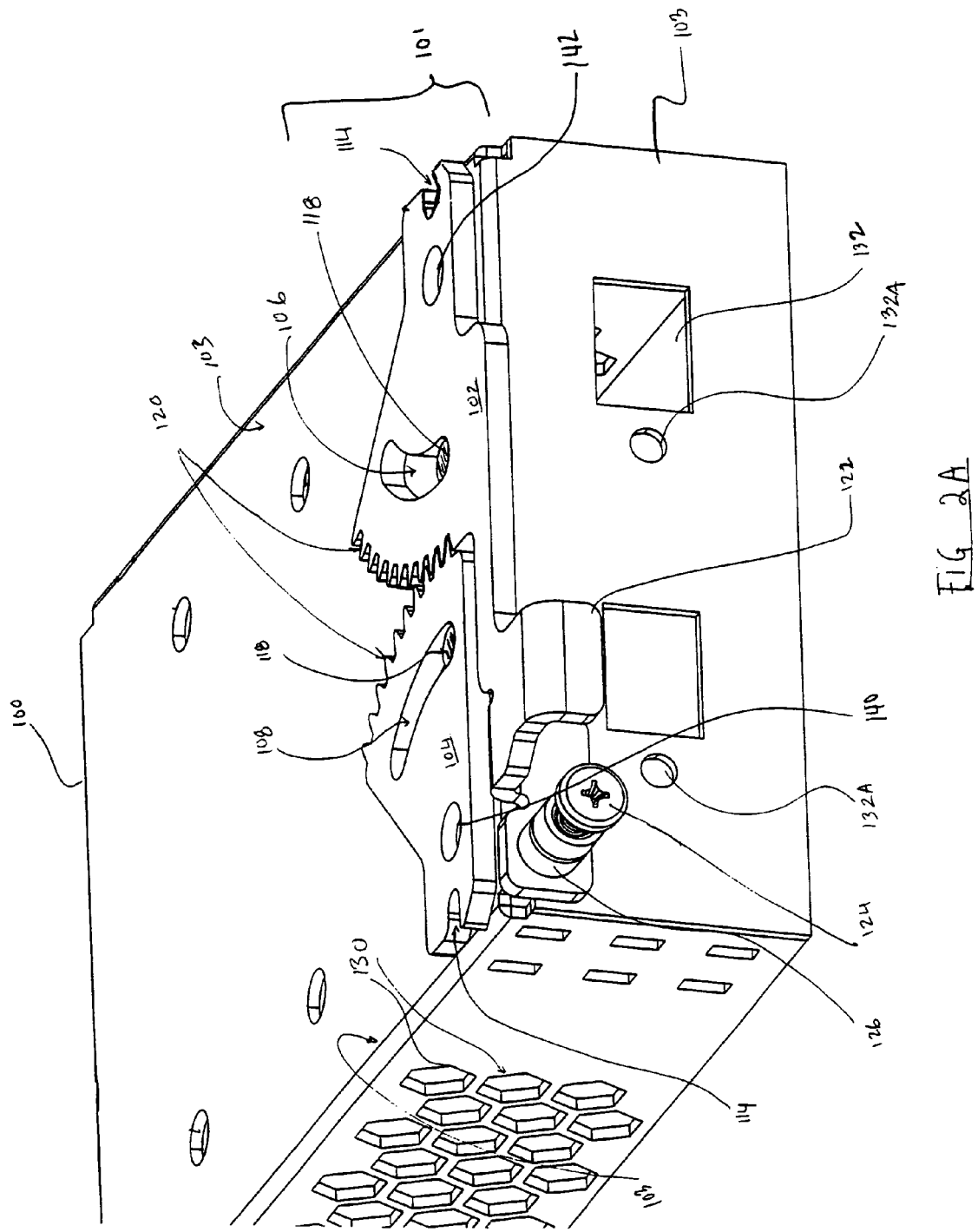
FIG. 2A illustrates an exemplary carrier with an ejector mechanism.

FIG. 2A illustrates a three-dimensional section of an exemplary embodiment of a carrier 100. In one embodiment, the carrier 100 is used as the carrier 24 of the file server 10. In other embodiment, the carrier 100 can be used to support numerous electronic devices of any particular computer system. In one embodiment, the carrier 100 supports a data storage device such as a disk drive, an optical drive, a tape drive, a CD-ROM (Compact Disk Read Only Memory) drive, a DVD-ROM (Digital Video Disk Read Only Memory) drive, a magnetic disk drive, or other type of similar data storage device. The carrier 100 can also support the disk drive 20 mentioned in FIG. 1A. In another example, the carrier 100 supports a circuit board such as a motherboard of a computer system, a circuit board for a file server system, a circuit board for a multiple disk drive storage device, a circuit board for a security server or a network computer system, to name a few. The carrier 100 can also support the circuit board 22 mentioned in FIG. 1A.

The carrier 100 allows for the insertion or removal of the electronic device from a chassis of the computer system. The chassis of the computer system can be the cage 20 shown in FIG. 1A.

Encapsulating the appropriate electronic device therein, the carrier 100 of FIG. 2A enables the insertion or removal of the electronic device into the interior of the chassis of the computer system that support such electronic device. Examples of the electronic device include a data storage device such as a disk drive, an optical drive, a tape drive, a CD-ROM drive, a DVD-ROM drive, a magnetic disk drive, or other type of similar data storage device and a circuit board. In one exemplary embodiment, the electronic device is releasably hot-plugged into the chassis. For many computer systems, hot-pluggable electronic devices are preferred since they eliminate the need to power down the computer system to swap out the electronic devices. For many other computer systems, the electronic devices need not be hot-pluggable.

In one embodiment, the computer system accommodates two different types of electronic devices, data storage devices and circuit boards. In one embodiment, the circuit boards are coupled to the back end of the chassis and the data storage devices are coupled to the front end of the chassis such as illustrated in FIG. 1A. The electronic devices can also be stacked horizontally (as opposed to vertically as shown in FIG. 1A). The computer system may also include as many arrays of the stacked devices as necessary as is well known in the art.

Continuing with FIG. 2A, the carrier 100 can be made out of metals (steel, aluminum, etc.) or other molded materials (e.g., molded plastic) that are suitable for supporting and encapsulating an electronic device. The carrier 100 contains no loose parts that could easily fall off during transport, insertion, or ejection that could damage the computer system or the electronic device encapsulated therein. In one embodiment, the carrier 100 has the shape of a box with guide rails (not shown) on the side of the carrier 100 so that the carrier 100 can be inserted into the chassis provided with complimentary guide rails to receive the carrier 100. In another example, no guide rail is necessary. The carrier 100 also has ventilation windows 130 to allow ventilation for the electronic device that the carrier 100 supports. The carrier 100 also includes slots 132 which can be used for connection to the external environment. Other windows such as windows 132A may be included for other needs; for example, these windows may allow the operator to observe the LED (light emitting diodes) that may be included in the electronic device to ensure proper operation.

The carrier 100 includes an ejector mechanism 101, which further includes an ejector pair having an ejector 102 and an ejector 104. The ejector mechanism 101 facilitates the insertion or the release of the electronic device that is mounted therein from the computer system that supports the particular electronic device. In one embodiment, the ejectors 102 and 104 are stamped sheet metal parts and each of the ejector 102 and the ejector 104 is pivotally mounted on a surface 103 of the carrier 100. A suitable connector such as a pivot pin (not shown) or any other fasteners can be used can be used to mount the ejector 102 and the ejector 104 to the surface 103 of the carrier 100 at pivot point 142 and pivot point 140. In one embodiment, the connectors are made out of metals. Each of the ejector 102 and the ejector 104 pivotally rotates about a point on the surface 103. For instance, the ejector 102 pivotally rotates about the point 142 and the ejector 104 pivotally rotates about the point 140.

FIG. 2B illustrates that in one exemplary embodiment, to mount the ejectors 102 and 104, pivot pins 110 and 112 are used to pivotally mount the ejectors at the pivot points 142 and 140. Conventional fasteners or screws can also be used to pivotally mount the ejectors 102 and 104 to the carrier 100.

Each of the ejectors 102 and 104 acts as a gear so that when the gear engages one another, both ejectors are simultaneously rotated. As the ejector 102 and 104 pivotally rotate, the carrier 100 can be removed or inserted into a chassis of the computer system (see below).

In one exemplary embodiment, the ejector 102 further includes a guide slot 106; and, the ejector 104 includes a guide slot 108 as illustrated in FIGS. 2A and 2B. One purpose of the guide slot 106 and the guide slot 108 is to define a moving path for each of the ejectors 102 and 104, respectively, when the ejectors pivotally rotate about the points 142 and 144 on the carrier 100. The guide slots 106 and 108 also determine the rotational angle for the ejectors 102 and 104.

Another purpose of the guide slots 106 and 108 is to stop the rotational movement of the ejectors 102 and 104. Two stop pins 118 are affixed to the surface 103 of the carrier 100 such that each is located within a guide slot. As illustrated in FIG. 2A and 2B, one stop pin 118 is located within the guide slots 106 and another stop pin 118 is located within the guide slots 108. When the ejector 102 and the ejector 104 are pivotally rotated about the pivot points 142 and 144, the guide slots 106 and 108 respectively slide along the stop pins 118. The rotations follows the path defined by the guide slots 106 and 108. The rotations of the ejectors 102 and 104 are stopped when the edges of the guide slots 106 and 108 meet the edges of the stop pins 118. The rotations of the ejectors 102 and 104 are thus dictated by the guide slots 106 and 108, respectively and are stopped by the stops pins 118.

In an alternative embodiment, only one of the ejectors, e.g., the ejector 102, includes a guide slot, e.g., the guide slot 106. Additionally, only one of the stop pin 118 is necessary. Since the ejectors 102 and 104 act as gears that engage one another as the ejectors are rotated, only one guiding slot and one stop pin are necessary.

Continuing with FIG. 2A, in one exemplary embodiment, each of the ejectors 102 and 104 further includes a plurality of gear teeth 120 configured into each ejector. The gear teeth 120 from the ejector 102 engage or disengage with the gear teeth 120 on the ejector 104 as the ejector pair pivotally rotate about the points 140 and 142 on the carrier 100. As the gear teeth 120 from the ejector pair engage or disengage one another, both of the ejectors move at the same time. Thus, only one ejector, for example the ejector 102 needs to be moved in order to simultaneously move both of the ejectors 102 and 104.

In one exemplary embodiment, an ejector handle 122 is coupled to the ejector 102. The ejector handle 122 can be an additional member that is attached to the ejector 102 using conventional connectors. The ejector handle 122 can be affixed to the ejector 102 using adhesives or suitable fasteners. Alternatively, and as shown in FIG. 2A, the ejector handle 122 is an extension from the ejector 102. The ejector handle 122 is used to move the ejector 102, which causes the ejector 102 to pivotally rotate. The moving of the ejector 102 causes the gear teeth 120 on the ejector 102 to engage or disengage the gear teeth 120 on the ejector 104 to move the ejector 104 together with the ejector 102. In one embodiment, to move the ejector 102, a force is applied to the ejector handle 122 (e.g., as an operator pushes against the ejector handle 122) to cause the ejector 102 to pivotally rotate about the point 142. In another example, a force is used to pull on the handle 122 (e.g., as the operator uses the ejector handle 122 to pull the ejector 102 toward the user). Pulling the ejector handle 122 also causes the ejector 102 to pivotally rotate in the opposite direction from pushing on the handle 122. As mentioned, the rotation of the ejector 102 will cause the rotation of the ejector 104 thereby moving both of the ejectors 102 and 104.

Still at FIG. 2A, in one exemplary embodiment, the ejector 102 includes a captive lock 126 which is used to lock the ejector pair in place when necessary. The captive lock 126 may be an extension of the ejector handle 122 or may be a separate member coupled to the ejector handle 122 using convention connectors or couplings. In one embodiment, the captive lock 126 includes a captive lock screw 124 inserted therethrough. The captive lock screw 124 can be any suitable screw well known in the art. The captive lock screw 124 can be screwed into a captive lock receptor 138 on the carrier 100 to lock the ejector 102 in place as illustrated in FIG. 3. The captive lock receptor 138 can simply be a hole (or optionally a hole with threaded wall) that is drilled into the carrier 100 as is well known in the art. As the captive lock screw is screwed into the captive lock receptor 138, the ejector pair is locked to the carrier 100. Alternatively, other well known devices can be used as the captive lock 126 to immobilize or lock the ejector pair. For example, a convention clip or fastener can be attached to the end of the handle 122 which will lock into another clip attached to the carrier 100. Immobilizing or locking the ejector pair secures the carrier 100 within the chassis of the computer system to prevent damages to the connectors of the electronic device that the carrier supports.

In one exemplary embodiment and as illustrated in FIG. 2A and FIG. 3, each of the ejectors 102 and 104 further includes an ejection slot 114. The ejection slots 114 are groves or carve out areas that are designed or configured into the ends of the ejectors that are opposite the gear teeth ends. Each of the ejection slots 114 is engageable with an ejection pin 134 or ejection pin 136 located on a chassis 200 (FIG. 3) of the computer system that accommodates the carrier 100. The ejection slots 114 engage with the ejection pins 134 and 136 on the chassis to lock the carrier 100 into the chassis 200. The ejection slots 114 disengage with the ejection pin to release the carrier 100 from said chassis. The ejection slots 114 and the ejector pins 134 and 136 also align the carrier 100 before the carrier 100 is fully inserted into the chassis 200. When the ejection slots 114 and the ejector pins 134 and 136 meet, the carrier 100 is inserted within an open side 204 of the chassis 200 without being tilted on any side. In one embodiment, the ejection slots 114 are designed so that they will fit snuggly with the ejector pins 134 and 136 as the carrier 100 is locked into place within the chassis 200.

FIGS. 4A–4D illustrate the rotational movement of the ejector pair as the carrier 100 is inserted or removed from the chassis 200 of the computer system. At FIG. 4A, the carrier 100 is in a "ready" position to be inserted into the chassis 200. In one embodiment, (as shown in FIG. 3), the carrier 100 is inserted into an open side 204 (e.g., open back side) of the chassis 200. In the "ready" position, the handle 122 is fully extended and the lower edges of the slots 108 and 106 are butted up against the stop pins 118 to stop the ejector 102 and 104 from moving or extending any further (see FIG. 4A). In one embodiment, the operator pushes the handle 122 in the direction of the arrow "A" causing the ejector 102 to pivotally rotate in the direction of the arrow "A." The gear teeth 120 of the ejectors 102 and 104 engage and disengage one another as the handle 122 is being pushed. Pushing the handle 122 simultaneously rotates both of the ejectors 102 and 104.

Continuing to FIGS. 4B–4C, the engagement and disengagement of the gear teeth 120 progress as the force applied to the handle 122 is continued. The handle 122 and the captive lock 126 are now moved closer and closer to the carrier 100 until the ejectors 102 and 104 are stopped by the stop pin 118 as shown in FIG. 4D. In FIG. 4D, the carrier 100 is secured into the chassis 200. In one embodiment, the captive screw 124 of the captive lack 126 is screwed into the captive lock receptor locking the ejectors 102 and 104 in place.

As the ejectors 102 and 104 are moved or rotated, the slots 114 are also rotated. In the "ready" position, the slots 114 do not encapsulate or engage the ejector pins 134 and 136 provided on the chassis 200 as shown in FIG. 3. In the "ready" position, the slots 114 are only rested against the ejector pins 134 and 136 as the carrier 100 is inserted inside the openside 204. As the ejectors 102 and 104 are continued to be rotated as force is continued to be applied against the handle 122, the slots 114 are therefore rotated to finally encapsulate or engage the ejector pins 134 and 136 within the slots 114. As the slots 114 and the ejectors pin 134 and 136 engage one another, the carrier 100 is secured within the chassis 200. For clarity sake, FIGS. 4A–4D also show the ejector pins 134 and 136 located on the chassis 200 as the ejector pins 134 and 136 engage or disengage the ejector slots 114. Note that the ejector pins are not physically attached to the carrier 100. Thus, FIGS. 4A–4D only illustrate the position of the ejector pins relative to the ejector slots 114 of the carrier 100.

To remove the carrier 100 from the chassis 200, the opposite of the sequence described above occurs. For example, the operator applies some forces to lift or to pull onto the handle 122 in the direction of the arrow "B" as shown in FIG. 4D. The handles 122 is continued to be pulled on in the arrow "B" direction until the ejector pair return to the "ready" position. During these movements, the ejector slots 114 rotates out of the ejector pins 134 and 136 to disengage the ejector pins 134 and 136 pushing the carrier 100 out of the chassis 200. Once the ejector pair is in the "ready" position as shown in FIG. 4A, the carrier 100 can be easily removed from the chassis.

Figure 5:
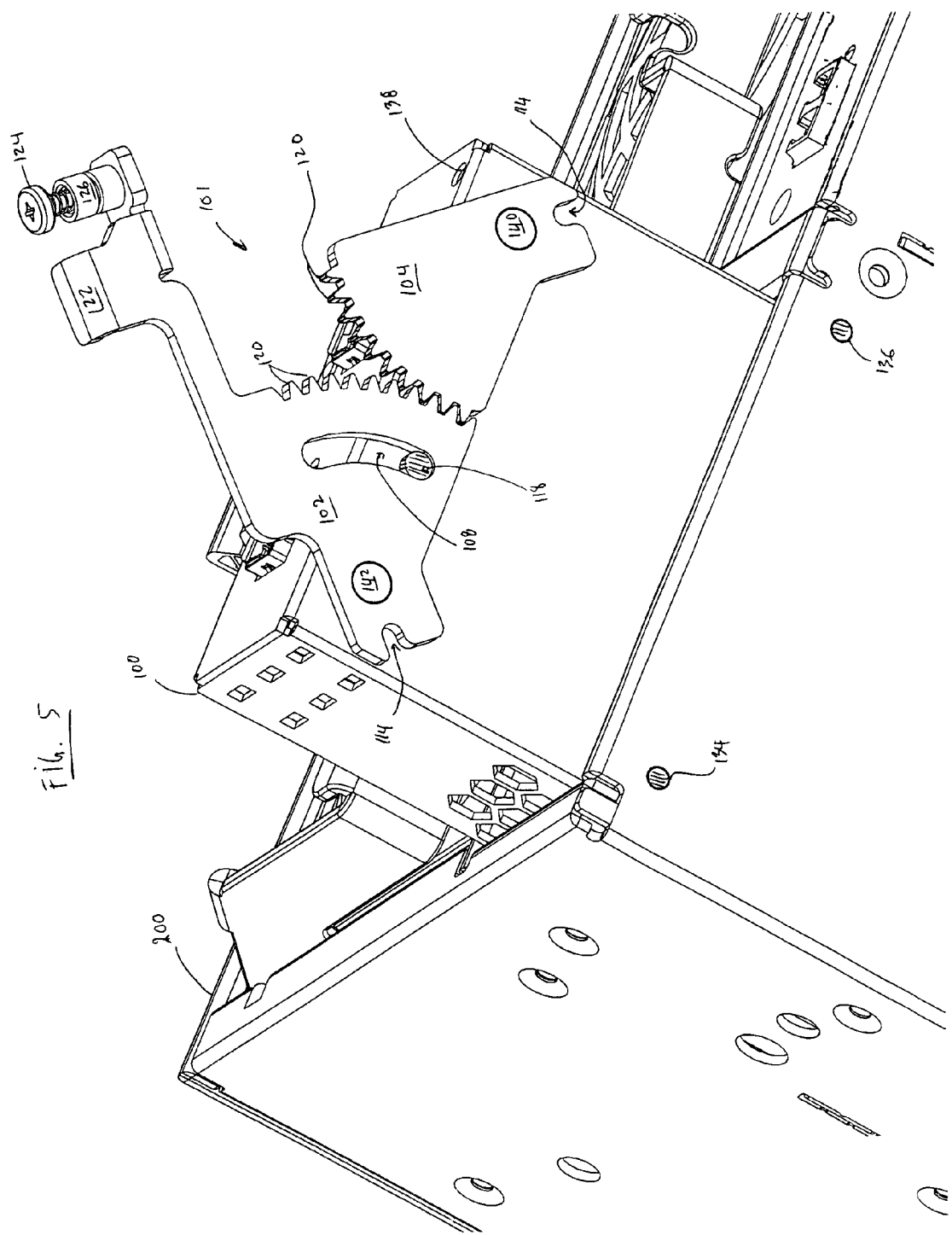
FIG. 5 illustrates a three-dimensional view of an exemplary carrier with an ejector mechanism being inserted into a chassis of a computer system.
Figure 6:
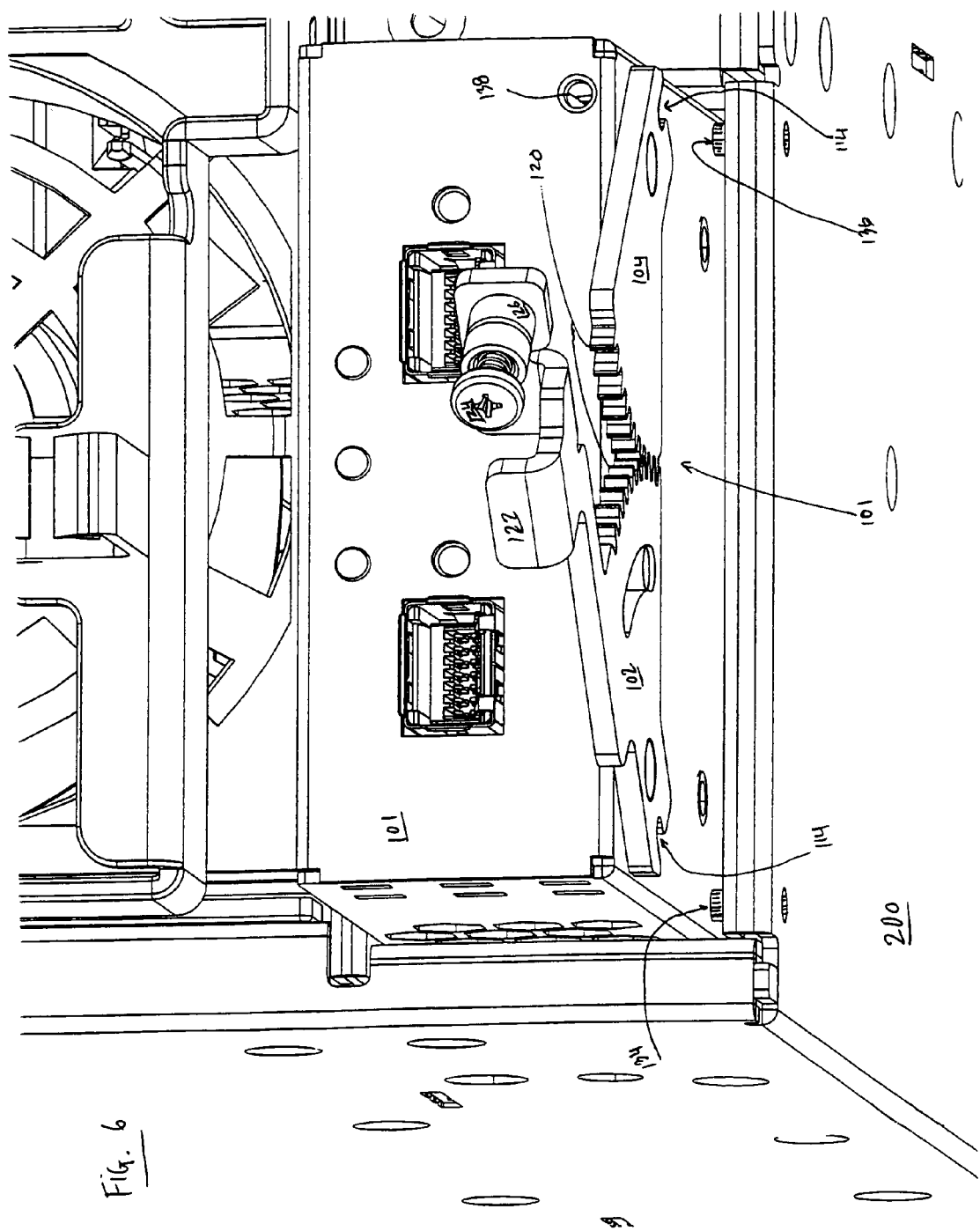
FIG. 6 illustrates another three-dimensional view of an exemplary carrier with an ejector mechanism being inserted into a chassis of a computer system.

FIGS. 5 and 6 further illustrate additional three-dimensional views of the carrier 100 as the carrier 100 is being inserted into or removed from the chassis 200. In one embodiment, to insert the carrier 100, the handle 122 is pushed down bringing the carrier 100 deeper within the chassis 200 and bringing the ejector slots 114 closer to and resting upon the ejector pins 134 and 136. As the handle 122 is continued to be pushed on as described above, the ejectors slots 114 slide over the ejectors pins 134 and 136 and the ejector slots 114 rotate about the ejectors pins 134 and 136 until the ejector pins 134 and 136 are encapsulated within the ejector slots 114. The ejector slot 114 and the ejector pins 134 and 135 align the carrier 100 within the chassis 200. Then, as the ejector slots rotate about the ejector pins, the carrier 100 is moved/inserted further without any change to the alignment. As discussed in FIG. 4D, as the ejector slots 114 engage the ejector pins 134 and 146, the carrier 100 can be secured and immobilized within the chassis 200.

Figure 7:
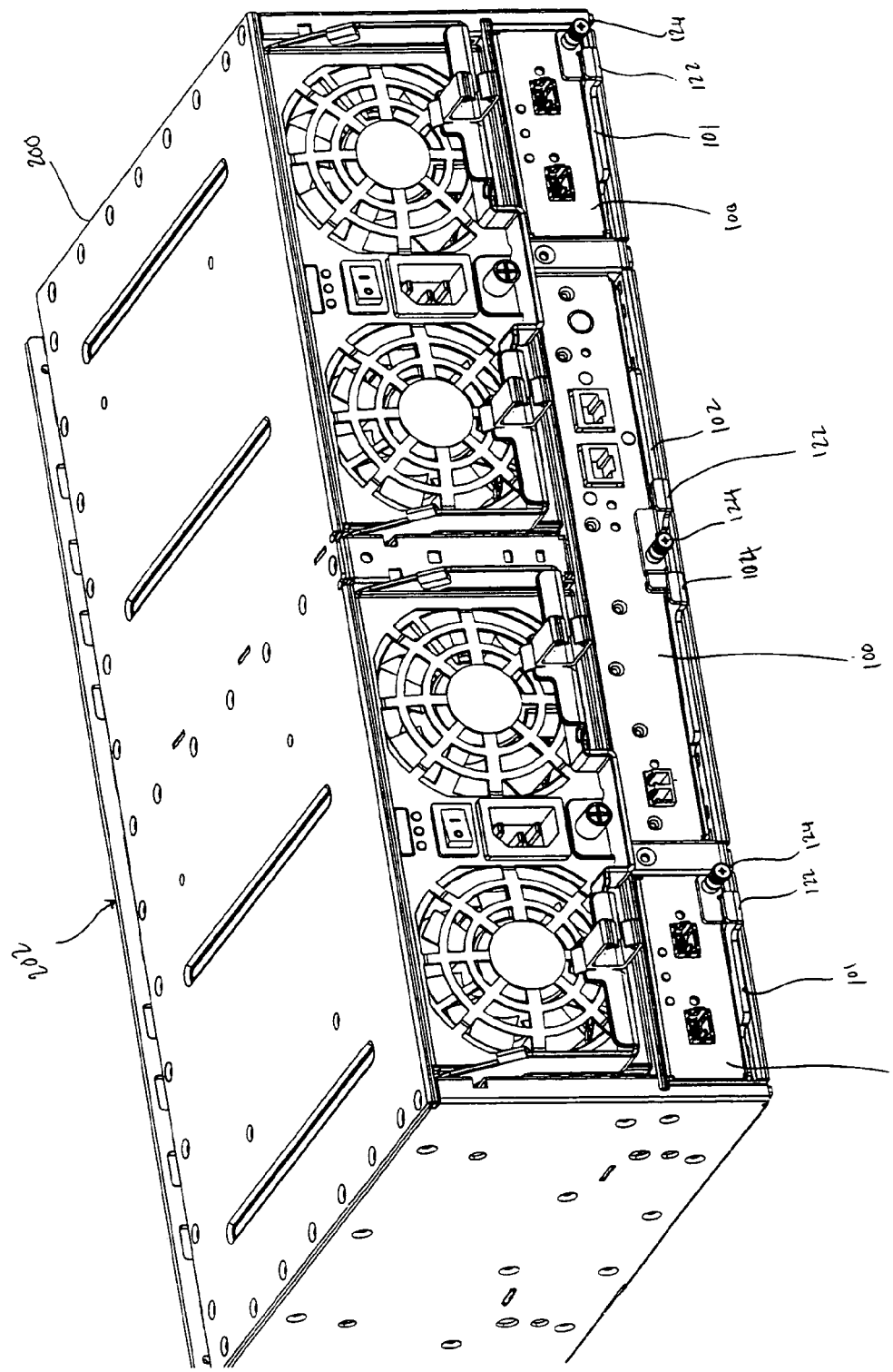
FIG. 7 illustrates an exemplary carrier with an ejector mechanism wherein the carrier is fully inserted within a chassis of a computer system.

FIG. 7 illustrates exemplary carriers 100 being fully inserted within the chassis 200. In one embodiment, each of the carriers 100 supports a circuit board of a network server. Once fully inserted, electrical connectors in each of the circuit board can be plugged into a common interconnection board 202 coupled to the chassis 200. The common interconnection board 202 provides electrical routing between the electrical connectors in each of the circuit boards, power supplies, storage devices, and other electronic devices.

Figure 8:
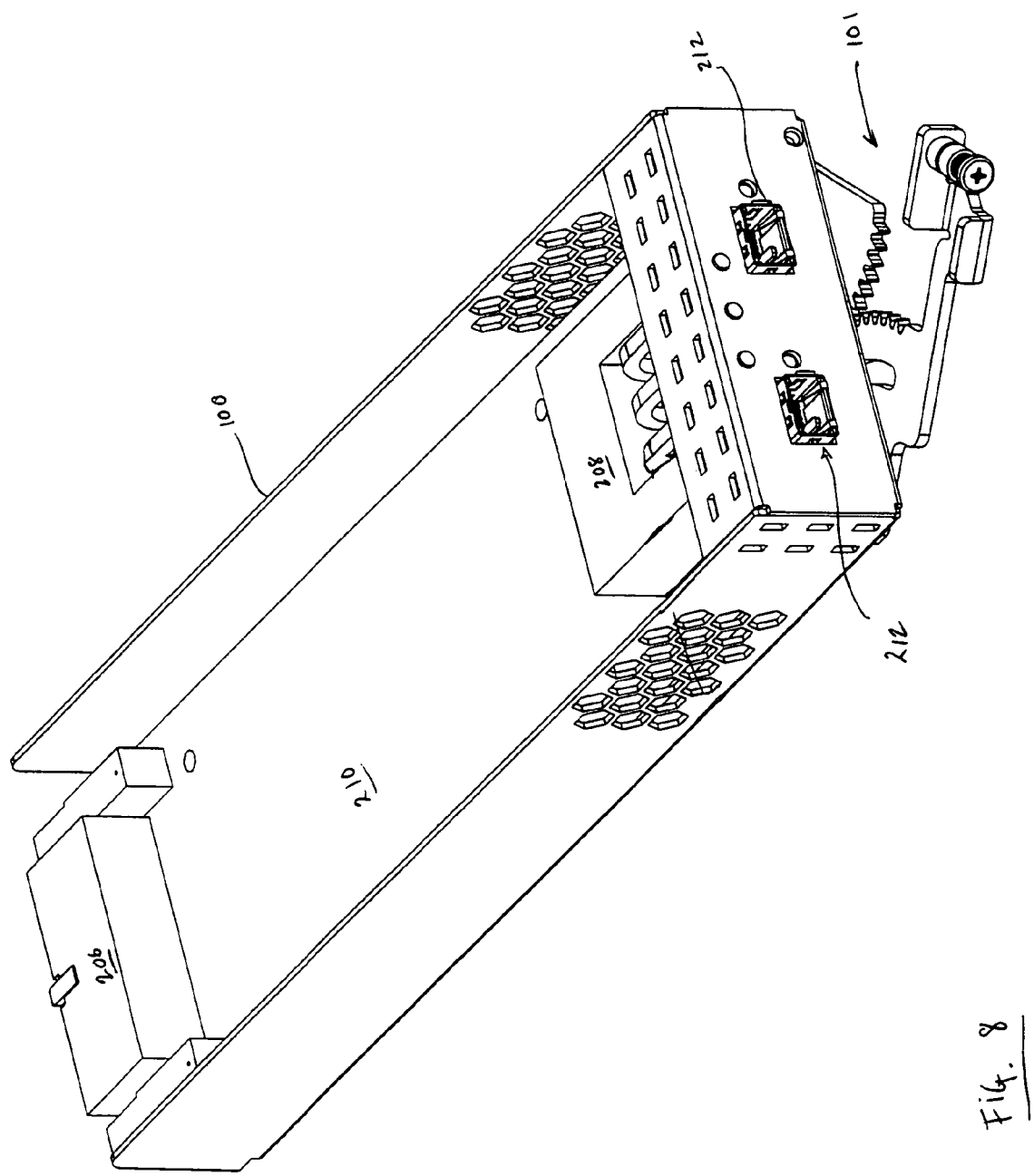
FIG. 8 illustrates an exemplary carrier having an ejector mechanism and supporting an electronic device.

FIG. 8 illustrates an exemplary embodiment wherein an electronic device such as a circuit board 210 is supported by the carrier 100. The circuit board 210 can be replaced by another electronic device in other embodiments; for example, the circuit board 210 can be replaced by a data storage device. The circuit board 210 can be mounted to the carrier 100 using conventional methods, for example, by using fasteners and clips. The circuit board 210 includes a connector 206 which electrically connects the circuit board 210 to other electronic devices. Once the carrier 100 is inserted into a chassis (e.g., the chassis 200), the connector 206 is plugged into the appropriate electrical connectors on a common interconnection board (e.g., the common interconnection board 202 shown in FIG. 7). Signal and data can be accessed through the connector 206 and the common interconnection board. The circuit board 210 also includes a plurality of electrical connectors 212. The electrical connectors 212 allow the circuit board 210 to be interconnected to the outside environment. A network cable can be plugged into the connectors 212 to access the circuit board 210.

FIG. 9 illustrates an application of the exemplary embodiments of the present invention. In one embodiment, a computer system 201 supports a plurality of data storage devices and a plurality of circuit boards. Such a computer system may include a file server, a network computer system, and a multiple data storage device, to name a few. The computer system 201 includes a chassis 200, a common interconnection board 207, a plurality of data storage devices 203 and a plurality of circuit boards 205. Each of the data storage devices and the circuit boards 205 is supported by the carrier 100 described above. Each of the carriers 100 includes the ejector mechanism 101 described above. The chassis 200 includes a back open side 211 and a front open side 209. The circuit boards 205 are inserted into the back open side 211 and the data storage devices 203 are inserted into the front open side 209 according to the exemplary embodiments discussed above. In one embodiment, the chassis 200 includes a plurality of slots each of which is to accommodate the insertion of one circuits board 205 or one data storage device 203.

The common interconnection board 207 is coupled to the chassis 200 and placed in a midplane of the chassis 200. The data storage devices 203 are connected or plugged into the common interconnection board 207 from the open front side 209 as is known in the art. The circuit boards 205 are connected or plugged into the common interconnection board 207 from the open back side 211 as is known in the art. The common interconnection board 207 has electrical connections that can couple to the corresponding electrical connections on the data storage devices 203 and the circuit boards 205. The common interconnection board 207 also includes all of the necessary external connection for the operation of the file server (e.g., a power supply).

One advantage of the ejector mechanism 101 of the exemplary embodiments discussed above is that the ejector pair prevents wobbling to the carrier 100 as the carrier 100 is being removed or inserted into the chassis 200. Unlike many conventional ejector mechanism of the prior art with one handle which tends to cause unbalance in the carrier, the ejector mechanism 101 prevents wobbling to the carrier 100 during the insertion or removal because of the incorporation of the gear teeth 120, which enables both of the ejectors 102 and 104 to simultaneously move. Additionally, wobbling to the carrier 100 during insertion or removal is prevented by the use of the ejector slots 114 and the ejector pins 134 and 136 which work to align the carrier 100. Furthermore, the gear teeth 120 allows force that is applied only to one ejector, for example the ejector 102, to be dispersed evenly between the two ejectors 102 and 104 to ensure that the carrier 100 is inserted or removed from the chassis with a proper alignment. In such event, the electrical connectors that are present in the electronic devices that are supported and transported by the carrier are protected from misalignment during transport.

Another advantage is that with the gear teeth 120, both of the ejectors 102 and 104 are moved simultaneously by only one action, namely, the force applied to the handle 122. With only one handle necessary, the ejector mechanism 101 can be made compact and not bulky since only one handle is necessary. Also, requiring only one handle enables for a longer lever arm which allows the user to move the handle with less force.

Further yet, the handle 122 can be made small and compact to accommodate the constraint of space in many computer systems since the action required to move the handle 122 is simple (e.g., only a push and pull is needed). One handle enables one-handed operation. It is difficult to get two hands into such a tight space to operate a two-handed operation as many conventional ejectors necessitate.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

We claim:

1. An ejector mechanism for a carrier adaptable to carry an electronic device therein comprising:
   an ejector pair, pivotally mounted on a surface of said carrier, each ejector comprises an ejector slot engageable with an ejector pin located on a chassis that accommodates said carrier;
   a plurality of gear teeth configured into said each ejector wherein said gear teeth on one ejector engage or disengage with said gear teeth on the other ejector as said ejector pair pivotally rotate about a point on said carrier; and
   a handle affixed to a selected ejector selected from said ejector pair.

2. The ejector mechanism as in claim 1 wherein said ejector slot engages with said ejector pin to lock said carrier into said chassis and wherein said ejector slot disengages with said ejector pin to release said carrier from said chassis.

3. The ejector mechanism as in claim 2 wherein said plurality of gear teeth are to release said carrier or to lock said carrier.

4. The ejector mechanism as in claim 1 wherein said handle is used to pivotally rotate said selected ejector which causes said gear teeth from said selected ejector to engage or disengage said gear teeth from the other ejector to move said ejector pair.

5. The ejector mechanism as in claim 1 further comprising:
   a captive lock coupling to said handle;
   a captive receptor coupling to said carrier wherein said captive lock engages or disengages said captive receptor to lock said ejector pair.

6. The ejector mechanism as in claim 1 wherein said each ejector further comprises a guide slot that defines a moving path for said each ejector when said each ejector pivotally rotates about said point on said carrier, and wherein when said each ejector is pivotally rotated about said point on said carrier, said guide slot is slideably moved along a stop pin located on said carrier to confine said ejector to said moving path.

7. The ejector mechanism as shown in claim 1 wherein said selected ejector further comprises a guide slot that defines a moving path for said ejector pair when said ejector pair is pivotally rotated on said carrier, and wherein when said ejector pair is pivotally rotated on said carrier, said guide slot is slideably moved along a stop pin located on said carrier to confine said pair to said moving paths.

8. The ejector mechanism as in claim 1 wherein said each ejector further comprises a guide slot that defines a moving path for said each ejector when said each ejector pivotally rotates about said point on said carrier, and wherein when said each ejector is pivotally rotated about said point on said carrier, said guide slot is stopped by a stop pin located on said carrier to confine said ejector to said moving path.

9. The ejector pair mechanism as in claim 1 wherein said selected ejector further comprises a guide slot that defines a moving path for said ejector pair when said ejector pair is pivotally rotated on said carrier and wherein when said ejector pair is pivotally rotated on said carrier, said guide slot is stopped by a stop pin located on said carrier to confine said ejector pair to said moving path.

10. The ejector mechanism as in claim 1 wherein said each ejector is comprised metal.

11. The ejector mechanism as in claim 1 wherein said carrier supports a data storage device pluggable into an electronic device coupled to said chassis wherein said electronic device is comprised within a common interconnection board.

12. The ejector mechanism as in claim 11 wherein data are recordable onto said data storage device and wherein said data is accessible by other devices when said carrier is plugged into said common interconnection board.

13. The ejector mechanism as in claim 12 wherein said data storage device is hot-pluggable.

14. The ejector mechanism as in claim 1 wherein said carrier supports a circuit board pluggable into an electronic device coupled to said chassis wherein said electron device is comprised within a common interconnection board.

15. The ejector mechanism as in claim 14 wherein said circuit board is hot-pluggable.

16. An apparatus comprising:
a chassis having an open front side, an open back side;
a carrier securable to said chassis from said open back side, said carrier including a first electronic device that is pluggable to a common interconnection board having a second electronic device, said common interconnection board is mounted within said chassis; and
an ejector mechanism coupling to said carrier wherein said ejector mechanism further comprises an ejector pair, pivotally mounted on a surface of said carrier, each ejector comprises an ejector slot engageable with an ejector pin located on a chassis that accommodates said carrier, a plurality of gear teeth configured into said each ejector wherein said gear teeth on one ejector engage or disengage with said gear teeth on the other ejector as said ejector pair pivotally rotate about a point on said carrier; and a handle affixed to a selected ejector selected from said ejector pair.

17. The apparatus as in claim 16 wherein said ejector slot engages with said ejector pin to lock said carrier into said chassis and wherein said ejector slot disengages with said ejector pin to release said carrier from said chassis.

18. The apparatus as in claim 16 to release said carrier or to lock said carrier.

19. The apparatus as in claim 16 wherein said handle is used to pivotally rotate said selected ejector which causes said gear teeth from said selected ejector to engage or disengage said gear teeth from the other ejector.

20. The apparatus as in claim 16 wherein said first electronic device is one of a circuit board and a data storage device.

21. The apparatus as in claim 16 wherein said ejector mechanism further comprising:
a captive lock coupling to said handle;
a captive receptor coupling to said carrier wherein said captive lock engages or disengages said captive receptor to lock said ejector pair.

22. The apparatus as in claim 16 wherein said each ejector further comprises a guide slot that defines a moving path for said each ejector when said each ejector pivotally rotates about said point on said carrier, and wherein when said each ejector is pivotally rotated about said point on said carrier said guide slot is slideably moved along a stop pin located on said carrier to confine said ejector to said moving path.

23. The apparatus as in claim 16 wherein said selected ejector further comprises a guide slot that defines a moving path for said ejector pair when said ejector pair is pivotally rotated on said carrier, and wherein when said ejector pair is pivotally rotated on said carrier, said guide slot is slideably moved along a stop pin located on said carrier to confine said pair to said moving paths.

24. The apparatus as in claim 16 wherein said each ejector further comprises a guide slot that defines a moving path for said each ejector when said each ejector pivotally rotates about said point on said carrier, and wherein when said each ejector is pivotally rotated about said point on said carrier, said guide slot is stopped by a stop pin located on said carrier to confine said ejector to said moving path.

25. The apparatus as in claim 16 wherein said selected ejector further comprises a guide slot that defines a moving path for said ejector pair when said ejector pair is pivotally rotated on said carrier and wherein when said ejector pair is pivotally rotated on said carrier, said guide slot is stopped by a stop pin located on said carrier to confine said ejector pair to said moving path.

26. The apparatus as in claim 16 wherein said each ejector is comprised of a metal.

27. The apparatus as in claim 16 wherein the first electronic device is hot-pluggable.

28. An apparatus comprising:
a chassis having an open front side, an open back side, and a midplane;
a first carrier insertable into and removable from said open front side, said first carrier to support a first pluggable electronic device;
a second carrier insertable into and removable from said open back side, said second carrier to support a second pluggable electronic device;
a common interconnection board mounted to said midplane wherein said first pluggable electronic device is plugged into one side of said common interconnection board and said second pluggable electronic device is plugged into the other side of said common interconnection board;
each of said first carrier and said second carrier further comprises an ejector mechanism having an ejector pair, said ejector pair is pivotally mounted on a surface of each of said first carrier and said second carrier, wherein each ejector comprises an ejector slot engageable with an ejector pin located on said chassis, wherein each ejector further comprises a plurality of gear teeth configured into said each ejector wherein said gear teeth on one ejector engage or disengage with said gear teeth on the ejector as said ejector pair pivotally rotate, and wherein a handle is affixed to a selected ejector selected from said ejector pair.

29. The apparatus as in claim 28 wherein said handle is used to pivotally rotate said selected ejector which causes said gear teeth from said selected ejector to engage or disengage said gear teeth from the other ejector to move said ejector pair.

30. The apparatus as in claim 28 wherein said first pluggable electronic device is a data storage device and said second pluggable electronic device is a circuit board and wherein said apparatus is a multiple disk storage computer system.

31. The apparatus as in claim 28 wherein said first pluggable electronic device is hot-pluggable.

32. The apparatus as in claim 28 wherein said second pluggable electronic device is hot pluggable.

33. The apparatus as in claim 28 wherein said electronic assembly is a network file server and wherein said first pluggable electronic devices and said second pluggable electronic devices are circuit boards.

34. The apparatus as in claim 28 wherein said ejector mechanism further comprising:
   a captive lock coupling to said handle;
   a captive receptor coupling to said carrier wherein said captive lock engages or disengages said captive receptor to lock said ejector pair.

35. The apparatus as in claim 28 wherein said selected ejector further comprises a guide slot that defines a moving path for said ejector pair when said ejector pair pivotally rotates, and wherein when said each ejector is pivotally rotated, said guide slot is slideably moved along a stop pin mounted on each of said first carrier and said second carrier to confine ejector pair to said moving path.

36. The apparatus as in claim 28 wherein said selected ejector further comprises a guide slot that defines a moving path for said ejector pair when said ejector pair pivotally rotates, and wherein when said ejector pair is pivotally rotated, said guide slot is stopped by a stop pin located on each of said first carrier and said second carrier to confine said ejector pair to said moving path.

* * * * *